(12) United States Patent
Rubenstein et al.

(10) Patent No.: US 6,948,235 B1
(45) Date of Patent: Sep. 27, 2005

(54) SHROUD INSTALLATION APPARATUS AND METHOD OF INSTALLATION

(75) Inventors: Brandon A. Rubenstein, Loveland, CO (US); Bradley E. Clements, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/829,839

(22) Filed: Apr. 22, 2004

(51) Int. Cl.[7] .............................................. B23P 19/02
(52) U.S. Cl. ......................................... 29/760; 29/884
(58) Field of Search ........................... 29/747, 759, 760, 29/874, 882, 884

(56) References Cited

U.S. PATENT DOCUMENTS

| | | | | |
|---|---|---|---|---|
| 4,117,585 A | * | 10/1978 | Smith ........................ | 29/566.3 |
| 4,203,196 A | * | 5/1980 | Fukushima et al. ........ | 29/566.3 |
| 4,372,041 A | * | 2/1983 | Winkelman ................. | 29/747 |
| 4,766,668 A | * | 8/1988 | Urness et al. ............... | 29/749 |
| 5,092,029 A | * | 3/1992 | Fisher et al. ................. | 29/739 |
| 5,355,583 A | * | 10/1994 | Osumi et al. ................ | 29/876 |
| 5,709,024 A | * | 1/1998 | Kugo .......................... | 29/747 |
| 5,771,574 A | * | 6/1998 | Kato et al. ................... | 29/861 |
| 5,850,693 A | * | 12/1998 | Guran et al. ................ | 29/884 |
| 6,463,653 B1 | * | 10/2002 | Gamel et al. ............... | 29/740 |

* cited by examiner

*Primary Examiner*—Ross Gushi

(57) ABSTRACT

In one embodiment, an apparatus for facilitating installation of a shroud on a pin grid comprises a first alignment structure including a first plurality of longitudinal elements adapted to be inserted within each gap of the pin grid along a first direction and a first handle extending in a perpendicular manner to the plurality of longitudinal elements, and a second alignment structure including a second plurality of longitudinal elements adapted to be inserted within each gap of the pin grid along a second direction and a second handle extending in a perpendicular manner to the second plurality of longitudinal elements, wherein when the first alignment structure and the second alignment structures are inserted within the pin grid, the first and second handles form at least a partial frame structure to receive the shroud in a position to receive pins of the pin grid.

20 Claims, 4 Drawing Sheets

SHROUD INSTALLATION APPARATUS AND METHOD OF INSTALLATION

FIELD OF THE INVENTION

The present invention is related to facilitating the insertion of a shroud structure over a pin grid.

DESCRIPTION OF RELATED ART

Computer circuit boards may employ a number of components to facilitate electrical and mechanical coupling of electronic components. For example, header pins are commonly employed to provide mechanical and electrical coupling for a backplane or other circuit board. A pin grid array typically includes a plurality of discrete pins arranged in a regular pattern. Due to the length of the respective header pins and their material characteristics, the header pins exhibit some mechanical tolerance. Accordingly, each pin does not always remain in a rigid, immovable position within the pin grid array. The header pins can be slightly displaced by application of moderate amounts of mechanical force. Greater amounts of mechanical force can bend or otherwise damage the header pins.

Some electrical connection systems employ a shroud for use with header pins. The shroud is inserted over header pins of the pin grid array. The shroud acts as the female part of a connector pair thereby protecting the header pins from damage, contaminants, etc. Also, the shroud may be independently mechanically coupled to the circuit board holding the pin grid array if desired for a particular application.

In general, a shroud can be inserted over header pins by rough manual alignment. Specifically, the shroud can possess "lead-ins" that possess slightly greater width at the insertion points to provide positioning tolerance. After a field technician places the header pins within the lead-ins, the shroud can be fully inserted over header pins for attachment to the circuit board. If the field technician misplaces the shroud, application of force downward to install the shroud over header pins can bend and otherwise damage header pins.

BRIEF SUMMARY OF THE INVENTION

In one embodiment, an apparatus for facilitating installation of a shroud on a pin grid comprises a first alignment structure including a first plurality of longitudinal elements adapted to be inserted within each gap of the pin grid along a first direction and a first handle extending in a perpendicular manner to the plurality of longitudinal elements, and a second alignment structure including a second plurality of longitudinal elements adapted to be inserted within each gap of the pin grid along a second direction and a second handle extending in a perpendicular manner to the second plurality of longitudinal elements, wherein when the first alignment structure and the second alignment structures are inserted within the pin grid, the first and second handles form at least a partial frame structure to receive the shroud in a position to receive pins of the pin grid.

In another embodiment, a method for facilitating installation of a shroud on a pin grid comprises inserting a first alignment structure through the pin grid so that the first alignment structure has respective longitudinal elements disposed between each gap of the pin grid array along a first direction, inserting a second alignment structure through the pin grid so that the second alignment structure has respective longitudinal elements disposed between each gap of the pin grid array along a second direction, wherein when the first and second alignment structures are inserted, the first and second alignment structures form at least a partial frame surrounding a portion of the pin grid array, positioning the shroud against the partial frame, and partially installing the shroud over the pin grid after the positioning.

DETAILED DESCRIPTION

Representative embodiments are directed to alignment structures and method of use thereof that facilitate the installation of a shroud over a pin array. The alignment structures may be implemented in pairs. Each of the pairs of alignment structures has a plurality of longitudinal elements adapted to be inserted within the gaps of the pin array. One of the pairs of the alignment structures is inserted along a first direction between the gaps of the pin array and the other alignment structure is inserted along a perpendicular direction. When inserted within the gaps of the pin array, the alignment structures cause the pins to be aligned in positions that are suitable to receive the shroud. Furthermore, the alignment structures shorten the free pin length thereby reducing the risk of bending a pin during installation of the shroud. The alignment structures may also form a frame to facilitate the positioning of the shroud before installation over the pins. In some embodiments, the alignment structures are implemented using an inexpensive material thereby allowing the structures to be disposed of after a single use if desired. By implementing alignment structures in this manner, representative embodiments cause shroud installation procedures by field technicians to occur in a relatively efficient manner.

Figure 1A:
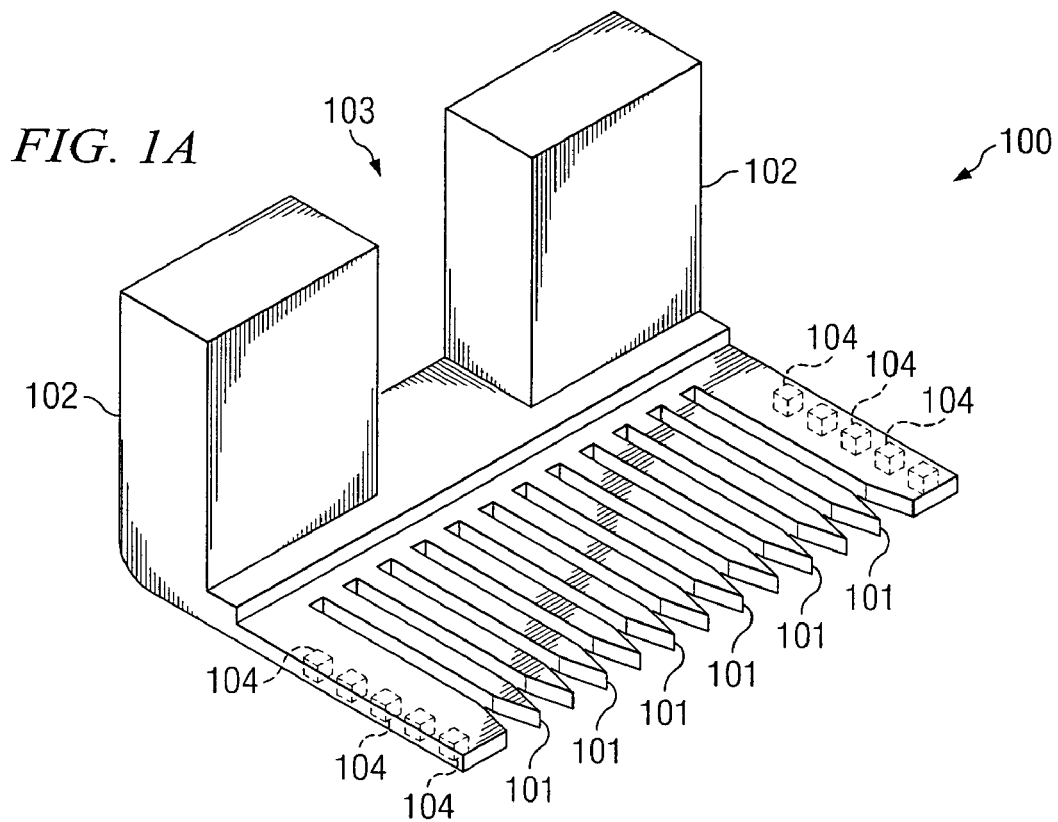
FIGS. 1A and 1B depict alignment structures according to one representative embodiment.
Figure 1B:
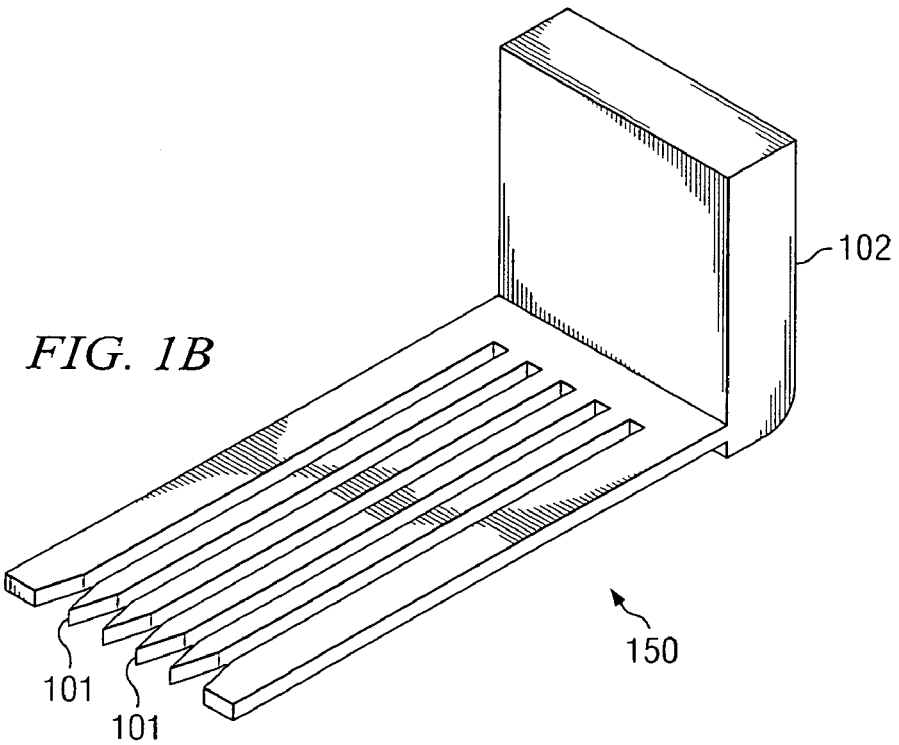

Referring now to the drawings, FIGS. 1A and 1B depict complementary alignment structures 100 and 150 according to one representative embodiment. Alignment structures 100 and 150 are configured in a "rake-like" manner. Specifically, alignment structures 100 and 150 include longitudinal members 101 that extend away from the bodies of structures 100 and 150. Additionally, alignment structures 100 and 150 possess handles 102 to assist the user's positioning of alignment structures 100 and 150 within a pin grid array. Alignment structures 100 and 150 may be constructed of any suitable material. For example, alignment structures 100 and 150 could be constructed of thermoplastic material. By doing so, the cost of structures 100 and 150 could be sufficiently low to enable the structures to be disposable. Accordingly, their use in field applications may be relatively convenient.

Longitudinal members 101 are adapted to be inserted within the gaps of a pin grid array. Longitudinal members 101 are sufficiently thick to provide structure to the pins during installation, but are also sufficiently thin to allow the shroud to partially engage the pins. The longitudinal members 101 of alignment structure 100 are adapted to be inserted along a first direction of a pin grid. By doing so, the pins of the pin grid array will be aligned in respective "columns." The longitudinal members 101 of alignment structure 150 are adapted to be inserted along a second direction of the pin grid. When longitudinal members 101 are positioned in this manner, longitudinal members 101 align the pins of the pin grid array in respective "rows." Alignment structure 100 may possess a plurality of blocks 104. Blocks 104 enable the longitudinal members 101 of alignment structure 150 to be properly oriented before the field technician attempts to place the members 101 within the pin grid array.

Figure 2:
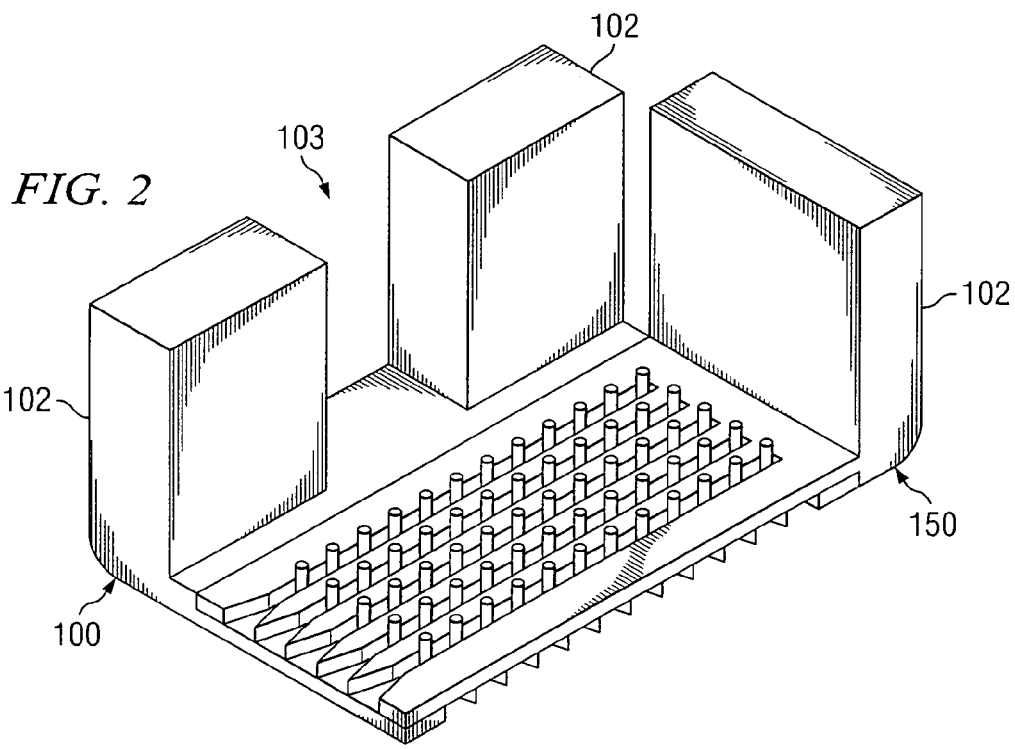
FIG. 2 depicts alignment structures positioned within a pin grid array according to one representative embodiment.

As shown in FIG. 2, the combination of alignment structures 100 and 150 retains the pins of a pin grid array in positions that are appropriate for the placement of a shroud over the pins. Additionally, alignment structures 100 and 150 restrict the mechanical tolerance of the pins thereby reducing the probability that the pins will shift while the shroud is placed over the pins. Furthermore, when longitudinal members 101 of structures 100 and 150 are appropriately positioned, the free pin length of the pins are shortened. The shortened fee pin length reduces the probability of bending or other damage.

Figure 3:
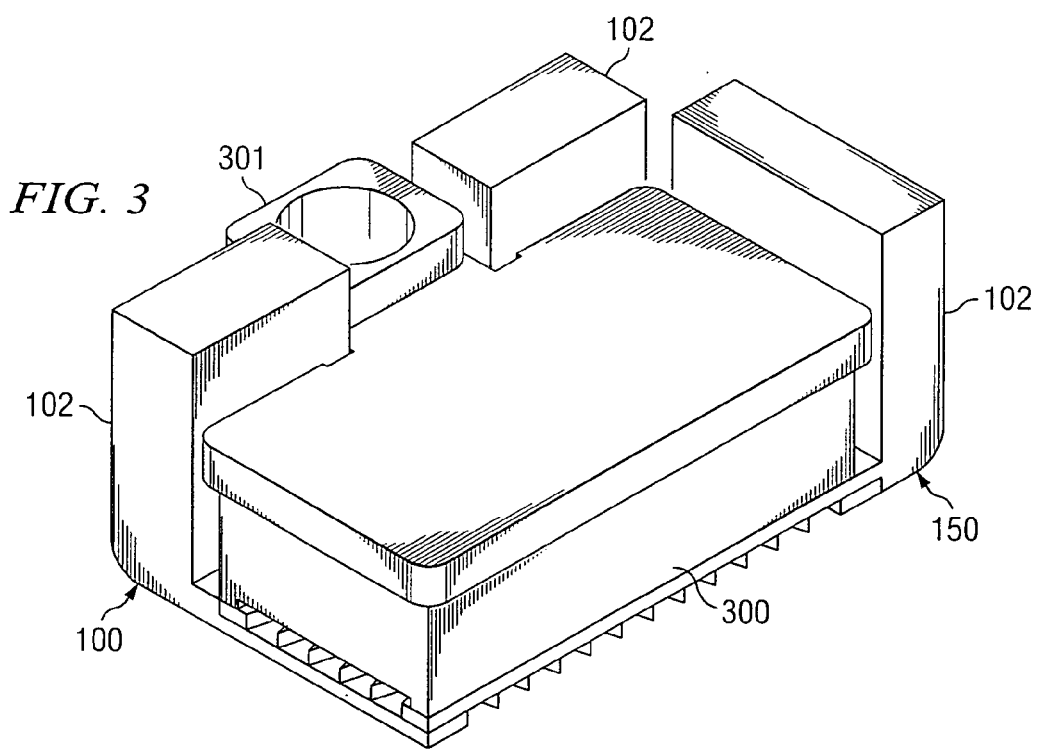
FIG. 3 depicts alignment structures cooperatively engaged to form a frame for a shroud according to one representative embodiment.

When alignment structures 100 and 150 are cooperatively engaged, handles 102 form a frame to maintain shroud 300 in an appropriate position as shown in FIG. 3. Alternatively or additionally, alignment structure 100 includes a gap or opening 103 associated with handle 102 (as shown more clearly in FIG. 1A). The gap or opening may be designed to accept a node or protruding member 301 of shroud 300 as shown in FIG. 3. The gap or opening 103 may be used to ensure that shroud 300 is properly oriented before the field technician attempts to place shroud 300 over the pin grid array.

Figure 4:
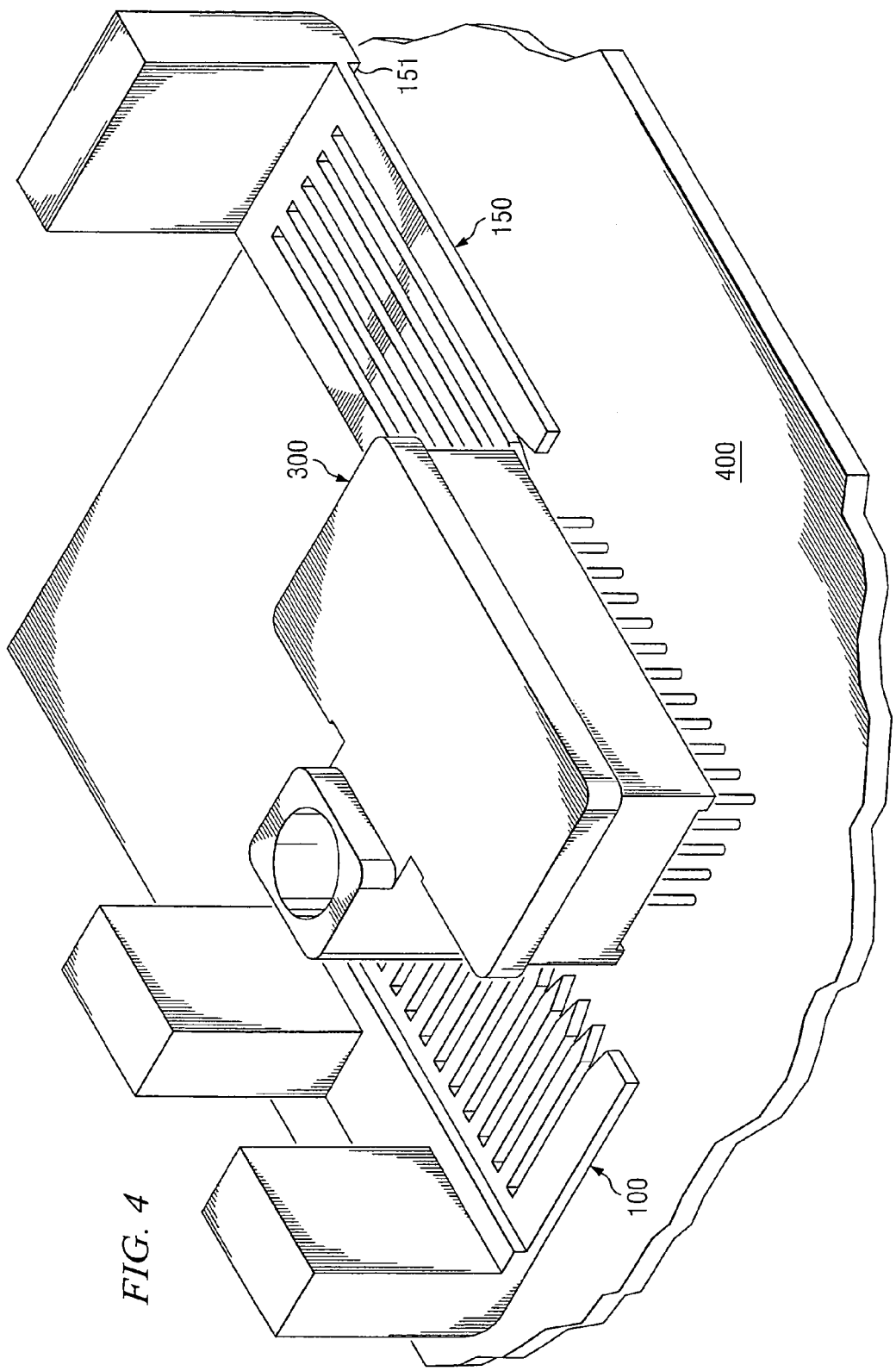
FIG. 4 depicts a circuit board having a pin grid array with a shroud partially installed using alignment structures according to one representative embodiment.

FIG. 4 depicts removal of alignment structures 100 and 150 after installation of shroud 300 over the pins of a pin grid array. Shroud 300 is shown to be partially inserted over the pins. Shroud 300 can then be relatively easily placed into its final position by the field technician. Additionally, as seen more clearly in FIG. 4, it is noted that alignment structure 150 comprises stop structure 151. Stop structure 151 contacts circuit board 400 to provide clearance for longitudinal members 101 of alignment structure 100.

Figure 5:
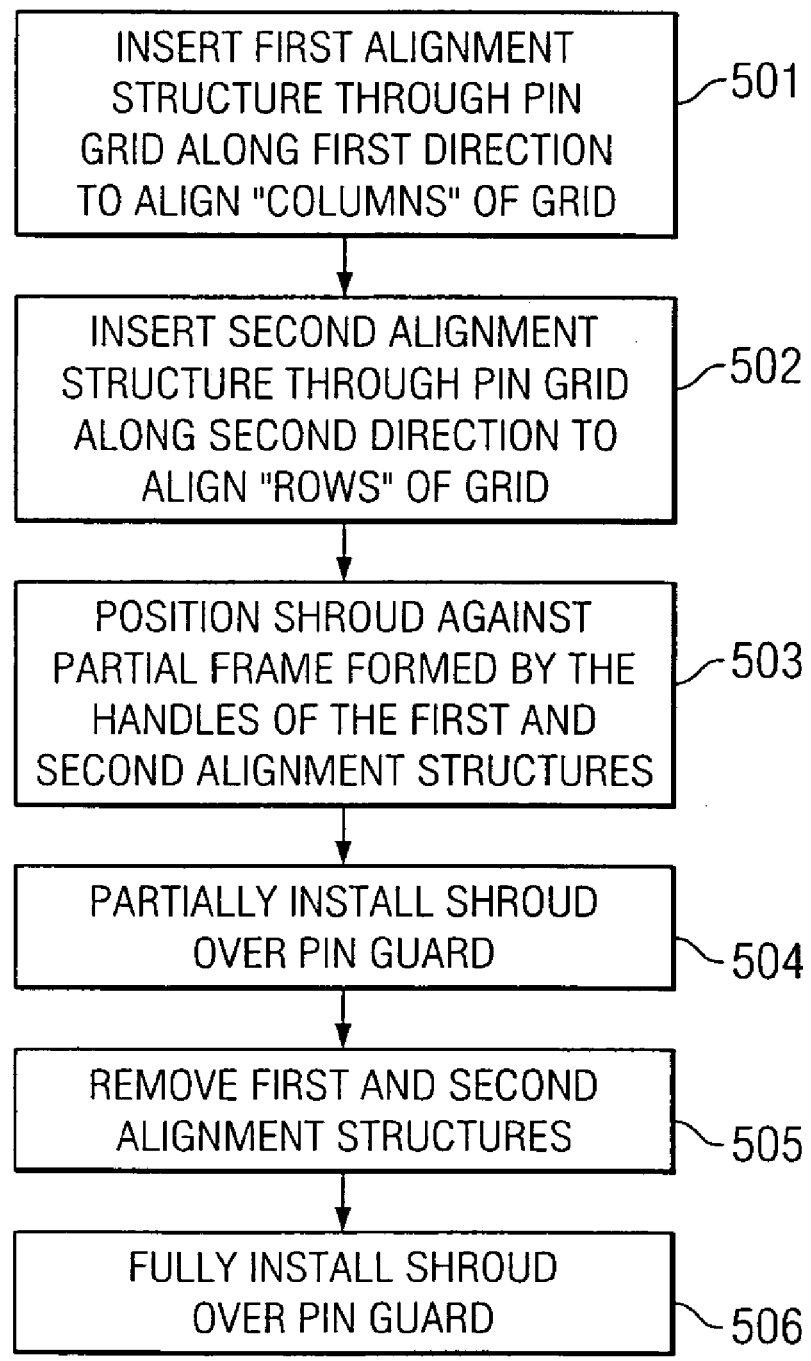
FIG. 5 depicts a flowchart associated with installation of a shroud over a pin grid array according to one representative embodiment.

FIG. 5 depicts a flowchart associated with installation of a shroud over a pin grid array according to one representative embodiment. In step 501, a first alignment structure is inserted through the pin grid array along a first direction to align the "columns" of the gird. In step 502, a second alignment structure is inserted though the pin grid array to align the "rows" of the grid. Although two alignments structures are described, representative embodiments may employ other numbers of alignment structures. For example, if the pin grid is sufficiently large, four alignment structures could be employed using one alignment structure for each side of the grid. In step 503, the shroud is positioned against the partial frame formed by the handles of the first and second alignment structures. Also, a protruding member of the shroud may be coupled to a suitable recess of a handle of one of the alignment structures. In step 504, the shroud is partially installed over the pin grid array. In step 505, the first and second alignment structures are removed. In step 506, the shroud is then fully installed over the pin grid array.

Some representative embodiments may enable a number of advantages. For example, the pins of a pin grid array may be appropriately aligned according to the openings of a shroud to facilitate the installation of the shroud in an efficient manner. Moreover, the reduction of the free pin length may reduce the probability of bending or otherwise damaging a pin during installation of the shroud. Moreover, because the cost of the alignment structures can be relatively low, the alignment structures may be used as disposable items. Thus, some representative embodiments enable field installation of shroud elements to occur in a convenient manner.

What is claimed is:

1. An apparatus for facilitating installation of a shroud on a pin grid, comprising:
   a first alignment structure including a first plurality of longitudinal elements adapted to be inserted within each gap of said pin grid along a first direction and a first handle extending in a perpendicular manner to said plurality of longitudinal elements; and
   a second alignment structure including a second plurality of longitudinal elements adapted to be inserted within each gap of said pin grid along a second direction and a second handle extending in a perpendicular manner to said second plurality of longitudinal elements;
   wherein when said first alignment structure and said second alignment structures are inserted within said pin grid, said first and second handles form at least a partial frame structure to receive said shroud in a position to receive pins of said pin grid.

2. The apparatus of claim 1 wherein one of said first and second handles comprises a gap.

3. The apparatus of claim 2 wherein said gap is adapted to receive a protruding member of said shroud to hold said shroud in a position to receive pins of said pin grid.

4. The apparatus of claim 1 wherein one of said first and second alignment structures comprises a plurality of blocks adapted to guide said plurality of longitudinal elements of said other alignment structure.

5. The apparatus of claim 1 wherein one of said first and second alignment structures comprises a stop structure underneath said handle adapted to provide spacing between a circuit board holding said pin grid and said plurality of longitudinal members of said other alignment structure.

6. The apparatus of claim 1 wherein said first and second alignment structures are formed from thermoplastic material.

7. A method for facilitating installation of a shroud on a pin grid, comprising:
   inserting a first alignment structure through said pin grid so that said first alignment structure has respective longitudinal elements disposed between each gap of said pin grid array along a first direction;
   inserting a second alignment structure through said pin grid so that said second alignment structure has respective longitudinal elements disposed between each gap of said pin grid array along a second direction, wherein when said first and second alignment structures are inserted, said first and second alignment structures form at least a partial frame surrounding a portion of said pin grid array;
   positioning said shroud against said partial frame; and
   partially installing said shroud over said pin grid after said positioning.

8. The method of claim 7 wherein one of said first and second alignment structures includes a gap in the partial frame.

9. The method of claim 8 wherein said shroud comprises a protruding member adapted for mechanically coupling said shroud to a circuit board and wherein said positioning comprises:

inserting said protruding member within said gap.

10. The method of claim 7 further comprising:

removing said first and second alignment structures after said partially inserting.

11. The method of claim 10 further comprising:

fully inserting said shroud over said pin grid after said removing.

12. The method of claim 7 wherein said first alignment structure comprises a plurality of blocks adapted to orient said longitudinal elements of said second alignment structure before insertion of said second alignment structure into said pin grid.

13. The method of claim 12 wherein said inserting said second alignment structure comprises:

inserting said longitudinal elements of said second alignment structure between said plurality of blocks.

14. The method of claim 7 wherein one of said first and second alignment structures comprises a stop structure adapted to provide spacing between a circuit board holding said pin grid and said longitudinal members of said other alignment structure.

15. An apparatus for facilitating installation of a shroud on a pin grid, comprising:

first alignment means for aligning pins of said pin grid according to a plurality of rows extending along a first direction, wherein said first alignment means possesses a first handle extending in a second direction perpendicular to said plurality of rows; and a second alignment means for aligning pins of said pin grid according to a plurality of columns extending along a third direction that is perpendicular to said first and second directions, wherein said second alignment means possesses a second handle extending in said second direction;

wherein, when said first and second alignment means are cooperatively engaged, said first and second handles form at least a partial frame structure to receive said shroud in a position for insertion of said pins of said pin grid within said shroud.

16. The apparatus of claim 15 wherein one of said first and second handles comprises an opening.

17. The apparatus of claim 16 wherein said opening is adapted to receive a node member of said shroud to retain said shroud in a position for insertion of said pins of said pin grid within said shroud.

18. The apparatus of claim 15 wherein said first alignment means comprises a plurality of blocks adapted to orient elements of said second alignment means before said second alignment means is positioned within said pin grid.

19. The apparatus of claim 16 wherein said first alignment means comprises a stop structure that contacts a circuit board that includes said pin grid such that said first alignment means is suspended above said second alignment means.

20. The apparatus of claim 16 wherein said first and second alignment means are constructed from thermoplastic material.

* * * * *